(12) United States Patent
Uyama

(10) Patent No.: US 8,623,674 B2
(45) Date of Patent: Jan. 7, 2014

(54) METHOD OF MANUFACTURING LIQUID EJECTION HEAD SUBSTRATE

(75) Inventor: Masaya Uyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 13/547,847

(22) Filed: Jul. 12, 2012

(65) Prior Publication Data

US 2013/0029437 A1    Jan. 31, 2013

(30) Foreign Application Priority Data

Jul. 29, 2011    (JP) ................................. 2011-166614

(51) Int. Cl.
*H01L 21/00*    (2006.01)

(52) U.S. Cl.
USPC ........ 438/21; 216/27; 257/415; 257/E21.001; 438/667; 438/692

(58) Field of Classification Search
USPC ............... 216/27; 257/415, E21.001; 438/21, 438/667, 691, 692
See application file for complete search history.

(56) References Cited

U.S. PATENT DOCUMENTS

| 6,379,571 | B1 * | 4/2002 | Kobayashi et al. | ............. 216/27 |
| 6,534,247 | B2 | 3/2003 | Milligan | |
| 7,267,431 | B2 * | 9/2007 | Anderson et al. | ............... 347/65 |
| 2008/0227035 | A1 * | 9/2008 | Kanri et al. | .................... 430/320 |
| 2011/0018934 | A1 * | 1/2011 | Uyama et al. | .................... 347/44 |

* cited by examiner

*Primary Examiner* — John C Ingham
(74) *Attorney, Agent, or Firm* — Fitzpatrick, Cella, Harper & Scinto

(57) ABSTRACT

A liquid ejection head substrate including a silicon substrate having a liquid supply port as hollow and slots as through holes connecting the hollow and a liquid channel arranged opposite sides of the substrate. The method includes etching the substrate to form the hollow; forming a first resist on the hollow; etching the first resist on the bottom of the hollow under conditions of securing an equal etching rate to both the silicon substrate and the first resist; forming a second resist on the hollow; patterning the second resist into an etching mask; and etching the substrate using the etching mask to form the through holes.

15 Claims, 10 Drawing Sheets

METHOD OF MANUFACTURING LIQUID EJECTION HEAD SUBSTRATE

BACKGROUND OF THE INVENTION

1. Field of the Invention

The present invention relates to a method of manufacturing a liquid ejection head substrate. More particularly, this invention relates to a method of manufacturing an inkjet recording head substrate.

2. Description of the Related Art

A known method of manufacturing an inkjet recording head as described in the specification of U.S. Pat. No. 6,534,247 includes a step of forming a layer containing therein an ink ejection energy generating element on the top of a silicon substrate and subsequently digging part of the layer down to the substrate, a step of forming a nozzle section on the layer, a step of wet-etching the substrate to form a common ink supply port, a step of applying resist in the common ink supply port, a step of patterning the resist on the bottom surface of the common ink supply port and a step of dry-etching the substrate until making the dry-etched part communicate with the dug part of the layer to form an individual supply port.

With the known silicon substrate (to be also referred to simply as substrate hereinafter) processing method, a hollow is formed in the substrate by utilizing anisotropic crystal etching, using an alkali solution, as a feasible technique. However, when forming a hollow by means of anisotropic crystal etching, differences in level can be produced on the bottom of the hollow under the influence of etching rate distribution and crystal defects of substrate. When a resist film is formed on such a hollow, the obtained resist film is apt to show a varied thickness due to the differences in level. Since thick parts and thin parts of such a resist film differ from each other in terms of extent of thinning after exposure to light and development performance, the size of opening of the resist film can show variance after a patterning process.

Meanwhile, methods of manufacturing an inkjet recording head including a substrate having a hollow can give rise to a phenomenon as described below. According to U.S. Pat. No. 6,534,247, a hole that serves to form an opening as individual supply port afterward is dug in advance from the surface where a nozzle is formed. However, when a nozzle section is formed by spin coating, the hole formed by digging in advance shows differences in level to give rise to a poor flatness in the nozzle section. When the nozzle section shows a poor flatness, the poorly flat nozzle section can adversely affect the printing quality. Therefore, when forming a nozzle section by spin coating, an individual supply port is preferably formed from a common ink channel arranged at the surface opposite to the surface where a nozzle has been formed. Then, the etching mask that is employed when forming an individual supply port at the bottom of the common ink supply port directly affects the size of opening of the individual supply port on the surface where the nozzle has been formed. In other words, a high dimensional accuracy is required to the etching mask. However, when forming a hollow as common ink supply port by means of anisotropic etching, using an alkali solution, the size of opening can show variance after a patterning process for the above-described reason to prevent a precision etching mask from being prepared. Then, as a result, the opening of the individual supply port (referred to also as slot) formed at the bottom of the hollow cannot necessarily show a desired profile.

SUMMARY OF THE INVENTION

Therefore, the object of the present invention is to provide a method of manufacturing a liquid ejection head substrate that can accurately form slots at the bottom of a hollow thereof.

According to the present invention, the above object is achieved by providing a method of manufacturing a liquid ejection head substrate including a silicon substrate having a first surface, a second surface disposed opposite to the first surface, and a liquid supply port and slots for supplying liquid to a liquid channel arranged on the first surface, the liquid supply port being formed as hollow at the side of the second surface, the slots being formed as through holes communicating with both the bottom of the hollow and the first surface, the method including: (1) a step of executing a first etching process from the side of the second surface to form the hollow in the silicon substrate; (2) a step of forming a first resist on the second surface and on the hollow; (3) a step of executing a second etching process on the first resist to remove at least the first resist on the bottom of the hollow, the second etching process being executed under conditions of securing an equal etching rate to both the silicon substrate and the first resist; (4) a step of forming a second resist on the hollow; (5) a step of forming an etching mask by patterning the second resist; and (6) a step of executing a third etching process, using the etching mask, to form the through holes, the above steps being conducted in the above listed order.

Further features of the present invention will become apparent from the following description of exemplary embodiments with reference to the attached drawings.

DESCRIPTION OF THE PREFERRED EMBODIMENTS

Now, the present invention will be described in greater detail by referring the accompanying drawings that illustrate embodiments of the invention. Note, however, that the embodiments do not limit the scope of the present invention in any sense of the words and are described below only to make the present invention fully clear to those who are skilled in the art.

First Embodiment

FIG. 1A through 1H are schematic cross-sectional views of a liquid ejection head substrate, sequentially illustrating the steps of the method of manufacturing a liquid ejection head substrate according to the present invention.

Figure 1A:
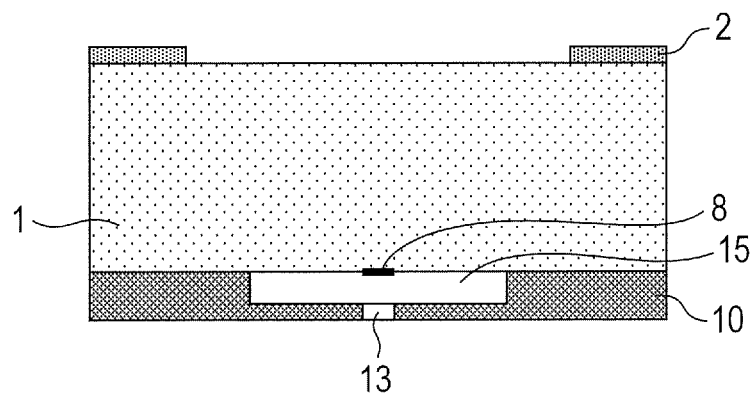
FIGS. 1A, 1B, 1C, 1D, 1E, 1F, 1G and 1H are schematic cross-sectional views of a substrate, illustrating an embodiment of the present invention for processing a substrate.

First, a silicon substrate 1 (to be also referred to simply as substrate hereinafter) having two surfaces as shown in FIG. 1A is prepared. In FIG. 1A, the surface at the side (lower side) where a channel forming member 10 is arranged is the first surface and the surface opposite to the first surface is the second surface.

An ejection energy generating element 8 that may be an actuator for ejecting liquid and wiring (not shown) for driving the ejection energy generating element 8 are formed at the side of the first surface of the substrate. Additionally, a channel forming member 10 having a liquid channel 15 and an ejection port 13 is formed at the side of the first surface.

The substrate is preferably a silicon single-crystal substrate. A hollow can be formed in a silicon-single-crystal substrate with ease by means of anisotropic crystal etching in a subsequent step.

A mask 2 to be used for forming a hollow in a subsequent step is formed on the second surface as also shown in FIG. 1A. Materials that can be used for the mask 2 include silicon oxide film, silicon nitride film, silicon oxynitride film and organic polymers. The mask 2 can be obtained by patterning by way of a general purpose semiconductor process so as to make it show a desired profile that is suitable for forming the hollow 3.

Figure 1B:
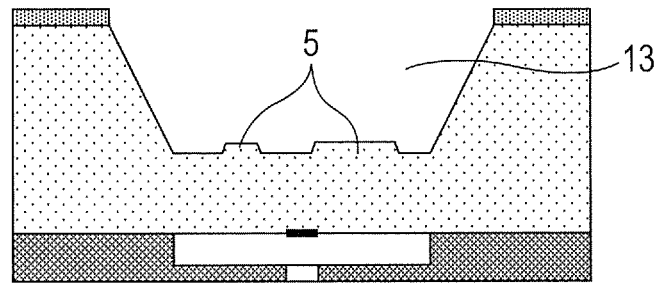

Then, a first etching process is executed on the substrate from the side of the second surface to form the hollow 3 that corresponds to a liquid supply port as shown in FIG. 1B.

An etching technique that is optimally suited for the substrate material can be selected for the first etching process. For example, if the substrate is a silicon single-crystal substrate, anisotropic crystal etching using an alkali solution can suitably be used for the first etching process. The alkali solution may be aqueous solution of potassium hydroxide (KOH), aqueous solution of tetramethylammonium hydroxide (TMAH) or the like.

Differences in level 5 may be produced at the bottom of the hollow 3 as a result of the first etching process.

Figure 1C:
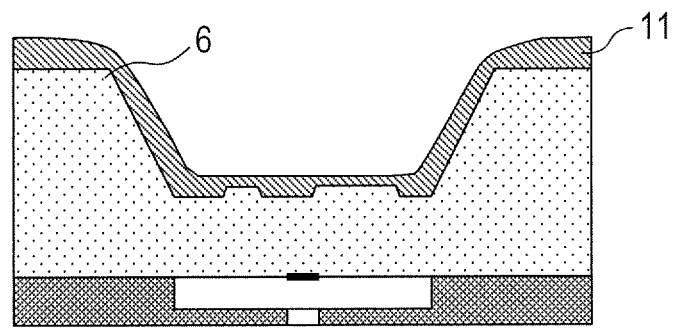

Then, as shown in FIG. 1C, first resist 11 is laid on the second surface and the surface of the hollow of the substrate 1.

Techniques that can be used for laying the first resist include spin coating, dipping and spray coating, although spray coating may preferably be used for laying the first resist.

Figure 1D:
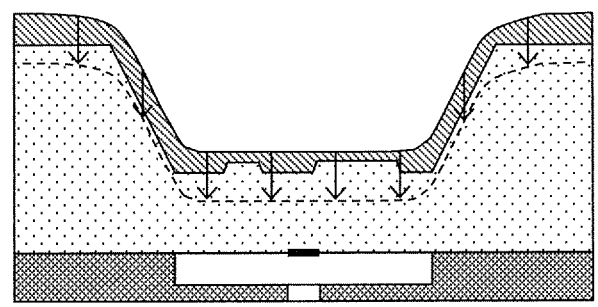

Then, as shown in FIG. 1D, a second etching process is executed on the second surface and the hollow 3 where the first resist is laid to remove at least the first resist at the bottom of the hollow 3.

The second etching process is executed under conditions that realize the same etching rate for both the first resist and the substrate.

In an instance where resist that is an organic substance and a silicon substrate are employed, the same etching rate can be realized for both the first resist and the silicon substrate by using dry etching. Then, the dry etching is preferably RIE (reactive ion etching) and a mixture gas of carbon fluoride ($CF_x$) and oxygen ($O_2$) is preferably employed for the reactive ion etching.

Resist that is an organic substance is normally dry etched by volatilization in the presence of oxygen, whereas silicon is normally dry etched by volatilization in the presence of fluorine. Basically, therefore, the resist etching rate is raised as more oxygen is introduced into the etching chamber, while the silicon etching rate is raised as the quantity of carbon fluoride in the etching chamber is increased. Conditions that can substantially equalize the etching rates of the two different materials of resist and silicon can be obtained by adjusting the mixing ratio of carbon fluoride and oxygen.

A mixing ratio of carbon fluoride and oxygen of $CF_x/O_2=1.0$ to $3.0$ can be realized, although $CF_x/O_2$ that equalizes the etching rates of the two different materials varies as a function of the resist material and the etching conditions (plasma power, substrate bias, pressure, substrate temperature).

RIE is preferably employed for the second etching process for two reasons. One is that RIE provides not only a volatilization effect by way of chemical reactions but also an effect of physically removing volatilized substances due to ion collisions so that the difference between the etching rate of the resist material and that of silicon can be reduced with ease. The other is that, since the second surface operates as mounting surface, the size of the opening of the hollow 3 is preferably small in terms of securing ink reliability and chip shrinking. Then, the use of RIE is preferable because this etching technique is rather anisotropic than isotropic and can etch a substrate in a direction perpendicular to the substrate.

Figure 1E:
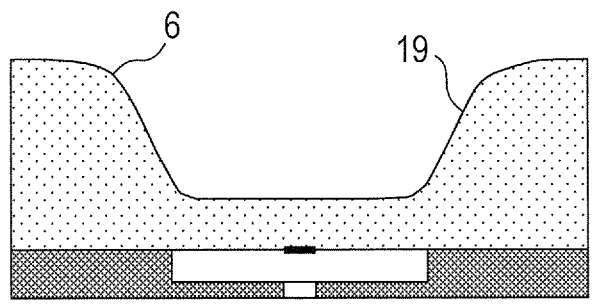

As a result of the second etching process, the hollow is etched as shown in FIG. 1E so as to show a surface profile that reflects the surface profile of the first resist 11 shown in FIG. 1C. Thus, the differences in level 5 produced at the bottom of the hollow 3 as shown in FIG. 1B are eliminated to realize an etched surface 19 having a flat surface area.

As the first resist is removed as a result of the second etching process, the differences in level at the bottom of the hollow are also eliminated. However, the substrate may be etched further as indicated by arrows in FIG. 1D after removing the first resist. Normally, it is not easy to remove only the first resist and the silicon substrate is also etched at the same time. Furthermore, since resist is generally laid thin at the opening of the hollow, the silicon substrate is etched at the opening as the first resist at the bottom of the hollow is removed.

Figure 1F:
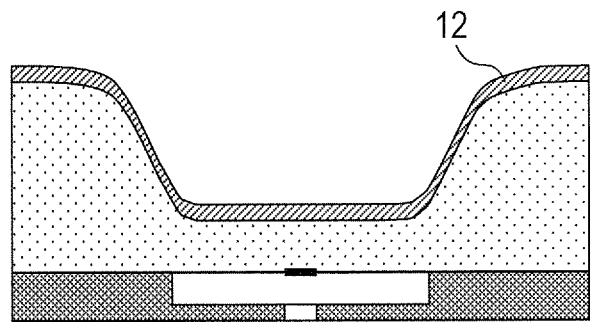

Then, as shown in FIG. 1F, second resist 12 is laid on the etched surface 19 including that of the hollow 3.

As pointed out above, the profile of the etched surface 19 reflects the surface profile of the first resist 11. In the second etching process, the surface profile of the edge portion 6 is made to reflect the surface profile of the first resist that is laid at the edge portion by means of a predetermined method. The viscosity, the surface tension and the resist laying technique of the first resist laid at the edge portion take major roles in determining the surface profile of the resist of that portion and the surface shows a profile that is stable under the selected resist laying conditions. Therefore, the coating effect of the second resist at the edge portion is improved when the second resist is laid under conditions (viscosity, surface tension, resist laying technique) similar to those of laying the first resist because the surface profile of the edge portion has been practically determined for the second resist at the edge portion under those resist laying conditions.

Then, as a result, the resist coat thickness required to the edge portion can reliably be secured if the second resist 12 is made thin. Thus, the degree of patterning accuracy is improved because the second resist can be laid thin for patterning the bottom of the hollow in a subsequent step.

In view of the above description, both the second resist 12 and the first resist 11 are preferably formed by using liquid resin. More preferably, same liquid resin is employed for both the second resist and the first resist. Furthermore, the same technique is preferably employed for laying the second resist and also for laying the first resist. Techniques that can be used for laying the resists include spin coating, dipping and spray coating, although spray coating may preferably be used.

Figure 1G:
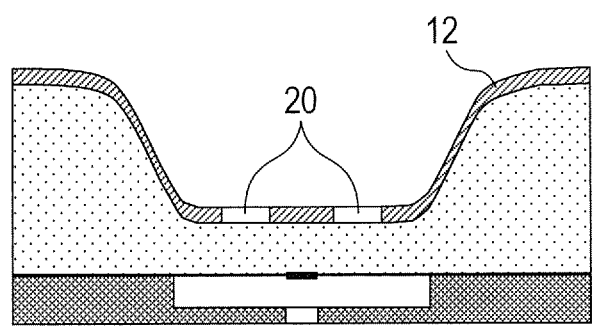

Then, the second resist is subjected to a patterning operation that includes exposure to light and development to produce an etching mask having pattern 20 as shown in FIG. 1G.

The operation of patterning the second resist can be realized highly precisely because the differences in level 5 of the bottom of the hollow 3 are removed to make the bottom flat and the second resist can be made to show a minimally required thickness in this step.

An exposure device having a long focal length can be used for exposure to light. A developing solution that matches the resist material can be employed. More specifically, alkali developing solution can suitably be used for positive resist of popular novolac resin.

Figure 1H:
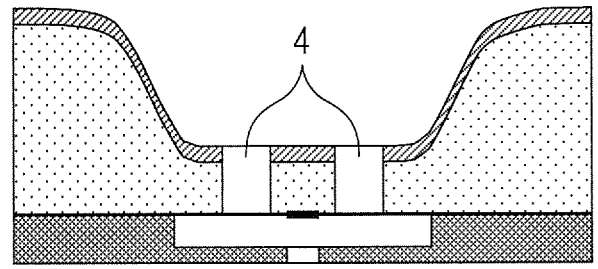

Then, slots 4 are produced by forming through holes that make the bottom of the hollow communicate with the first surface by means of a third etching process using an etching mask as shown in FIG. 1H.

Dry etching can non-limitatively be used for the third etching process. A Bosch process of repeating an etching step and a deposition step that can perpendicularly etch silicon may preferably be employed for such a dry etching process.

Thus, a liquid ejection head substrate is manufactured by way of the above-described steps.

Second Embodiment

Figure 2A:
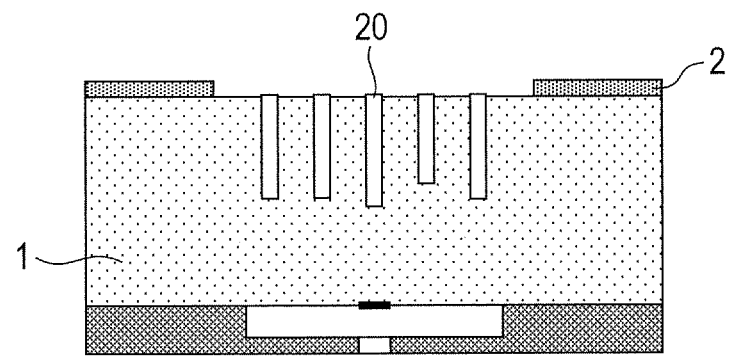
FIGS. 2A, 2B, 2C, 2D, 2E, 2F, 2G and 2H are schematic cross-sectional views of a substrate, illustrating another embodiment of the present invention for processing a substrate.

FIG. 2A schematically illustrates a step of forming liquid chemical introducing holes at the second surface of a silicon substrate 1 before forming a hollow 3 by way of a first etching process using anisotropic crystal etching.

Figure 2B:
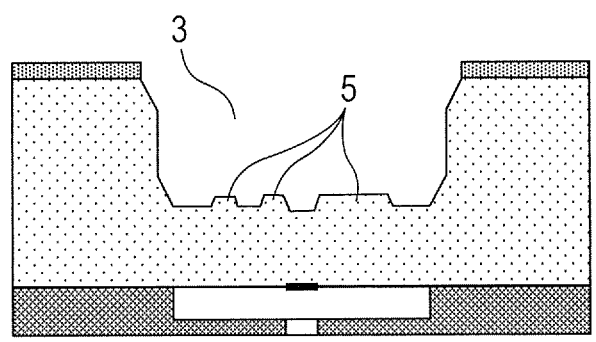
Figure 2C:
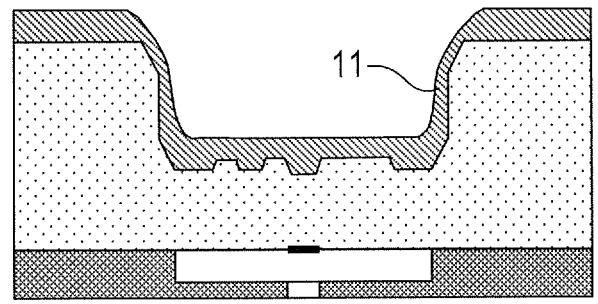
Figure 2D:
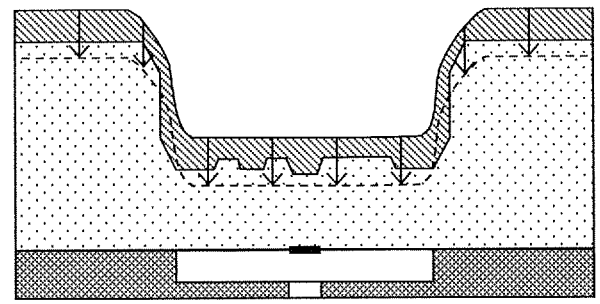

As will be understood by comparing FIG. 1D and FIG. 2D, the hollow 3 can be formed with a narrow opening by forming the hollow by means of anisotropic crystal etching after forming liquid chemical introducing holes 20. As the size of the opening of the hollow 3 is reduced, a small chip size can be adopted to allow an increased number of chips to be cut out per wafer to consequently reduce the manufacturing cost.

Techniques that can be used to form liquid chemical introducing holes include laser machining, drill machining, sand blast machining and dry-etching, although the use of laser machining is preferable.

Then, liquid chemical introducing holes 20 are formed with a degree of variance relative to a certain target depth value as a function of machining accuracy.

Otherwise, this step is the same as that of the first embodiment and hence will not be described here any further.

FIG. 2B schematically illustrates the step of forming a hollow 3. The bottom of the hollow 3 shows differences in level 5 that is attributable to the variance of depth of the liquid chemical introducing holes in addition to the influence of etching rate and crystal defects.

FIG. 2C through 2H schematically illustrates the steps corresponding to those of FIG. 1C through 1H that are already described in detail above. Hence, these steps will not be described here repeatedly.

Figure 2E:
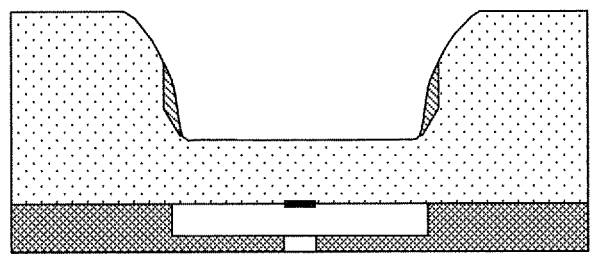
Figure 2F:
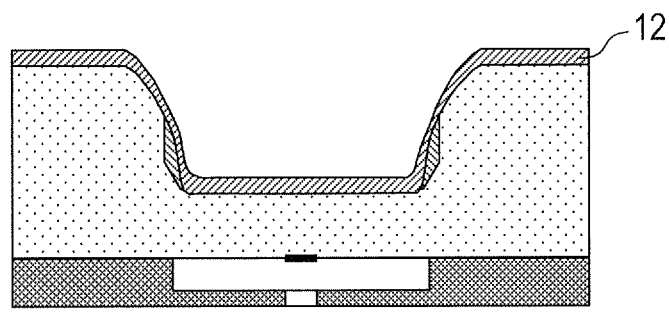
Figure 2G:
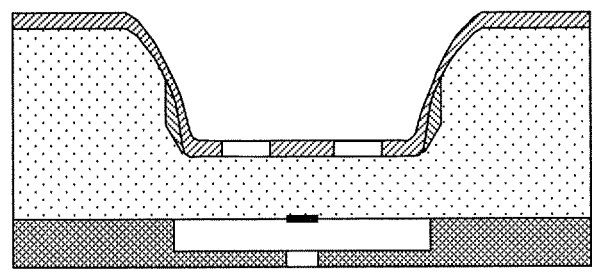
Figure 2H:
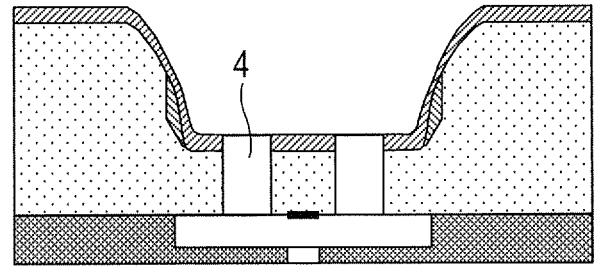

Note, however, the first resist 11 may remain at the lateral wall of the hollow after the second etching process as shown in FIG. 2E. The remaining first resist may be removed with the second resist or left there unremoved.

As described above, if the bottom of the hollow is made to show differences in level 5 due to the variance of depth of the liquid chemical introducing holes 20, the differences in level can be removed according to the present invention. Therefore, when the opening of the hollow 3 is made narrow, the second resist 12 for defining the slots 4 can be patterned highly accurately. As a result, the slots 4 can be formed highly accurately.

Third Embodiment

Figure 3A:
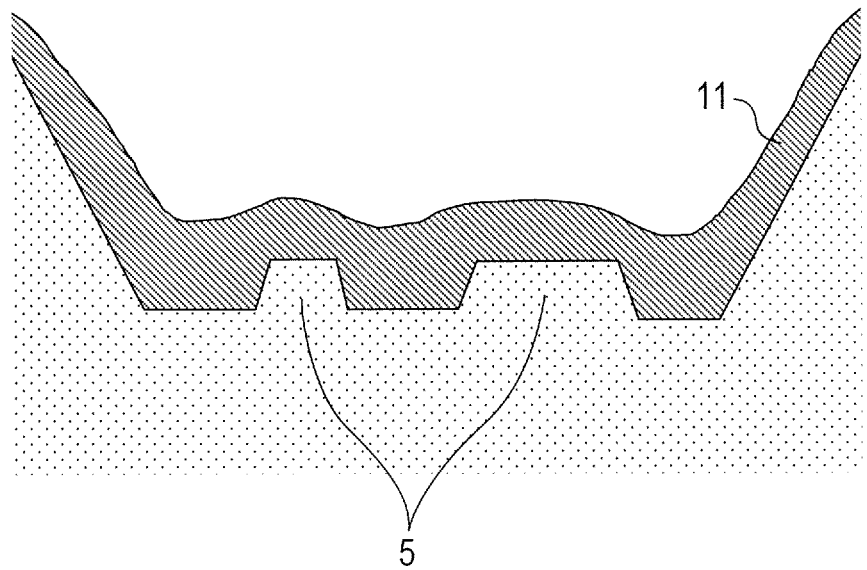
FIGS. 3A and 3B are enlarged schematic cross-sectional views of a region that corresponds to the hollow in FIG. 1C, illustrating an embodiment of the present invention.
Figure 3B:
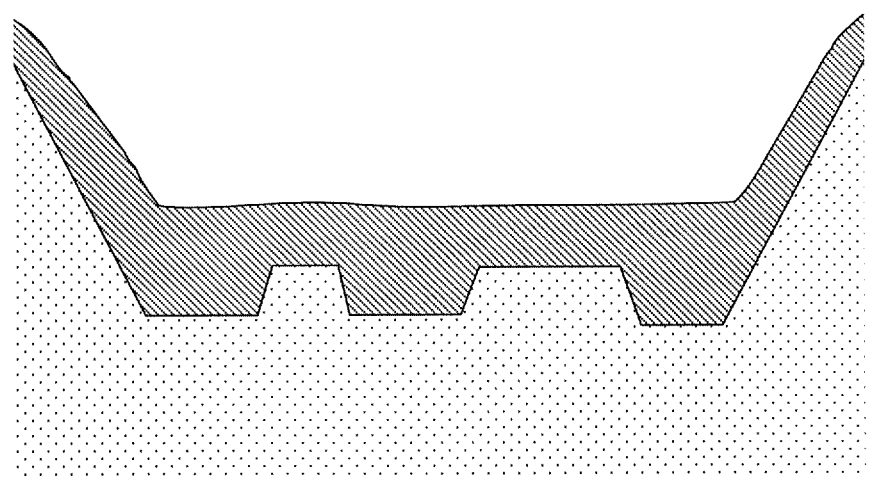

FIGS. 3A and 3B are enlarged schematic cross-sectional views of a region that corresponds to the bottom in FIG. 1C.

FIG. 3A shows a state where first resist 11 is formed on the bottom showing differences in level 5. Spray coating is preferable for forming the first resist 11 as described above for the first embodiment. However, when liquid resin is applied to the hollow by spray coating, the first resist can be formed to reflect the differences in level.

If such is the case, a step of flattening the surface of the first resist 11 that is formed on the bottom of the hollow 3 is preferably added. FIG. 3B is a schematic cross-sectional view showing the surface of the first resist 11 after executing a flattening process.

Techniques that can be used to flatten the surface of the first resist include, for example, a technique of heating the first resist to not lower than the glass transition temperature thereof to fluidize the resist. Additionally, the use of resist having a low molecular weight for the first resist is effective from the viewpoint of fluidizing the first resist. The temperature of fluidization is preferably between about 100 and 130° C.

Another technique that can be used to fluidize the first resist is blowing a solvent that can dissolve the first resist 11 against the first resist in order to re-dissolve and fluidize the first resist 11. The solvent may suitably be blown against the first resist by spraying.

Figure 4A:
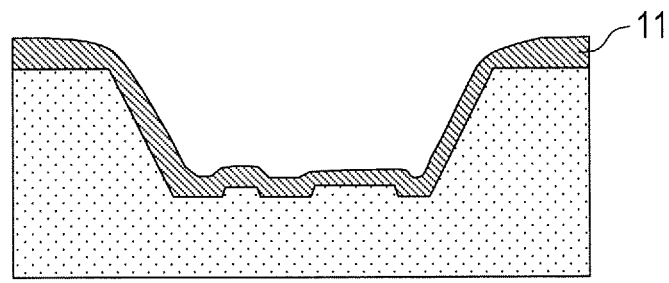
FIGS. 4A, 4B and 4C are schematic cross-sectional views of a substrate, illustrating still another embodiment of the present invention for processing a substrate.
Figure 4B:
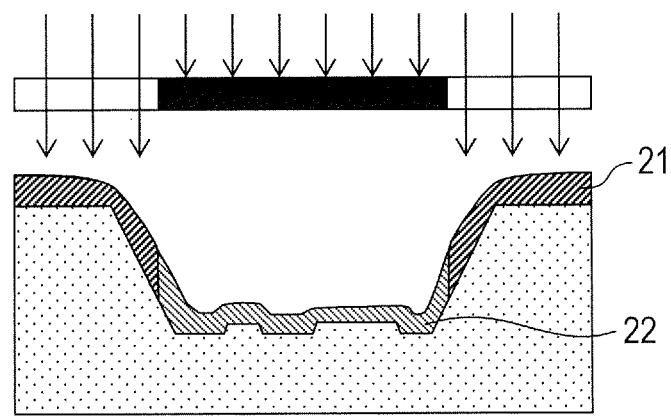
Figure 4C:
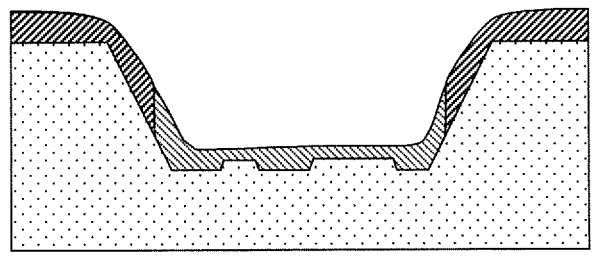

As the surface of the first resist is fluidized and flattened, part of the first resist that is desirably not fluidized may also be fluidized. The edge portion 6 shown in FIG. 1C typically represents such a part. To avoid this problem, negative resist may be used for the first resist 11 and the part that is desirably not fluidized may be exposed to light and hardened before executing the step of fluidizing and flattening the first resist. FIG. 4A through 4C schematically illustrate a step of exposing the first resist to light and subsequently flattening the first resist. In FIG. 4B, denotes the area 21 of the first resist that is exposed to light to harden the first resist and the area 22 that is not exposed to light. As a result of executing this step, the part of the first resist that has been exposed to light is not fluidized in the flattening process because it has been hardened, while the part that has not been exposed to light is fluidized and hence can be flattened. In this way, a flattening process can be executed while keeping the edge portion in a covered state.

When the first resist is flattened by heat, a chemical amplification type resist is preferably employed as negative resist. Many chemical amplification type resists have a low glass transition temperature and hence can be flattened with ease.

The hardened part and the part that has not been exposed to light may show respective etching rates that are different from each other in the second etching process. If such is the case, the part that has not been exposed to light may be exposed to light and hardened after the flattening process so as to make them show the same etching rate.

Figure 5:
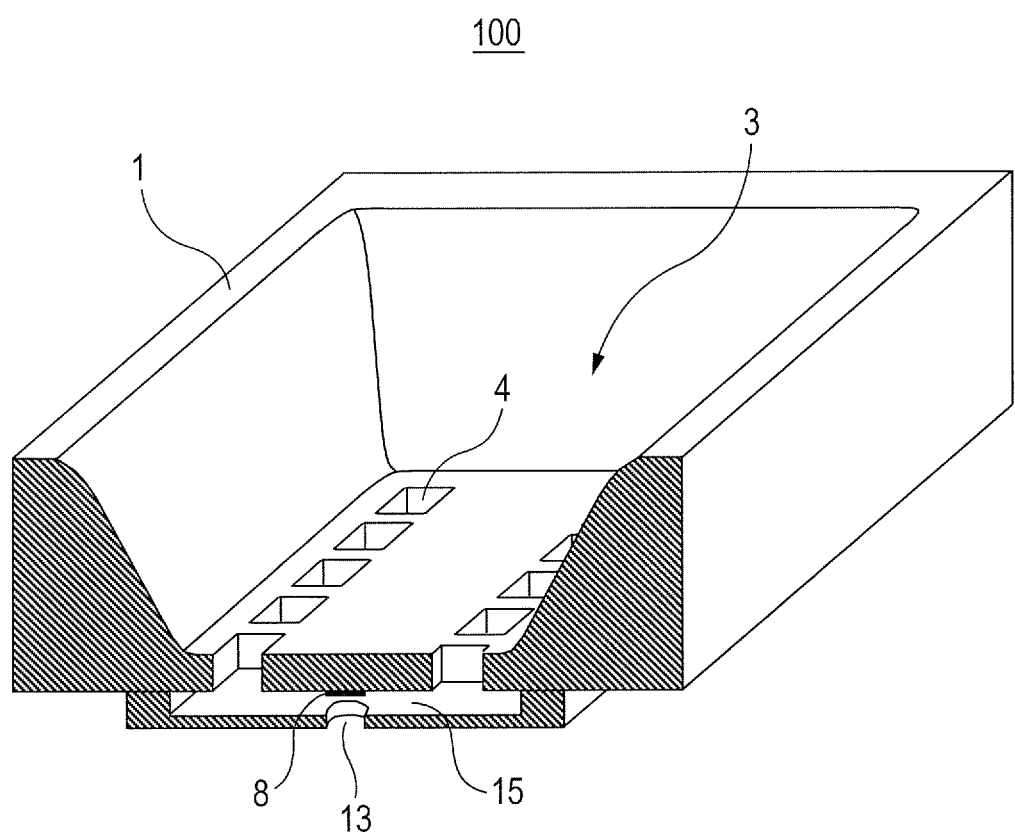
FIG. 5 is a schematic perspective view of a liquid ejection head, illustrating the configuration thereof, as cut in a direction perpendicular to the surfaces of the substrate thereof.

FIG. 5 is a schematic perspective view of a liquid ejection head 100 including a liquid ejection head substrate manufactured according to the present invention, illustrating the configuration thereof, after partly cutting away the liquid ejection head 100. The liquid ejection head substrate includes a silicon substrate 1 that contains an ejection energy generating element 8 for generating energy necessary for ejecting liquid and wiring (not shown) for driving the ejection energy generating element 8 that are formed at the side of the first surface. A channel forming member 10 for forming a liquid channel 15 and an ejection port 13 is formed on the first surface of the liquid ejection head substrate. A hollow 3 that operates as liquid supply port is formed at the side of the second surface of the silicon substrate 1. Slots 4 having openings at the first surface are arranged at the bottom of the hollow 3. Liquid such as ink is fed from the liquid supply port to the liquid channel 15 via the slots 4.

The present invention can be applied to methods of forming a liquid supply port and slots for supplying liquid to a silicon substrate. According to the present invention, slots 4 can highly accurately be formed from the first surface where an ejection energy generating element 8 and wiring are formed and the oppositely disposed second surface. Then, as a result, shrinks of chips can be suppressed and the yield of manufacturing liquid ejection head substrates can be raised.

Example

Now, an example in which a liquid ejection head was manufactured by means of the method of manufacturing a liquid ejection head substrate according to the present invention will be described in detail by referring to FIG. 6A through 6K illustrating different manufacturing steps.

Figure 6A:
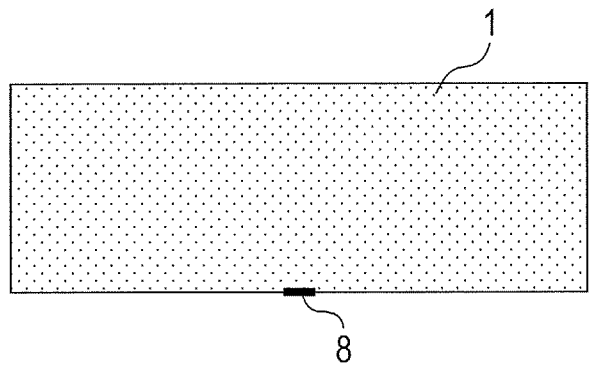
FIGS. 6A, 6B, 6C, 6D, 6E, 6F, 6G, 6H, 6I, 6J and 6K are schematic cross-sectional views of a substrate, illustrating the method of manufacturing the inkjet recording head of an example.

Firstly, a silicon substrate 1 in which an ejection energy generating element 8 and wiring (not shown) for driving the element 8 are formed at the side of the first surface as shown in FIG. 6A was prepared. The silicon substrate 1 had a thickness of 725 μm and was a single-crystal silicon substrate for which ingot had been drawn in the orientation of <100>.

Figure 6B:
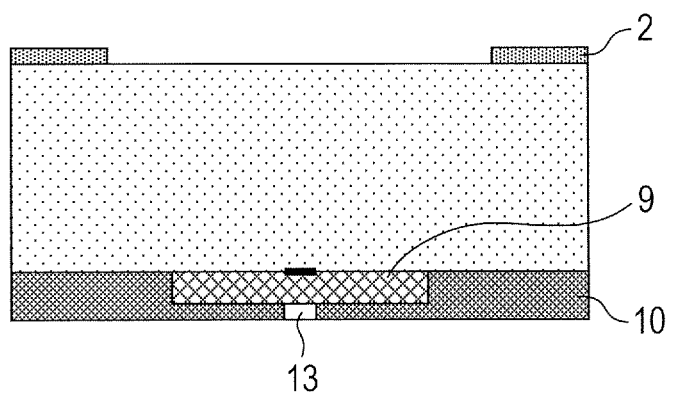

Then, a channel mold material 9 was formed as mold material for forming a liquid channel on the surface (first surface) of the side where the ejection energy generating element 8 had been formed as shown in FIG. 6B.

Positive resist containing poly(methyl-isopropenyl-ketone) as main component material was used as the channel mold material. After arranging the positive resist on the first surface, the positive resist was exposed to deep-UV and developed for patterning to produce the channel mold material.

Additionally, a channel forming member 10 is formed so as to cover the channel mold material 9. The channel forming member 10 was formed from cationic polymerization type epoxy resin by spin coating. The channel forming member 10 was exposed to light and developed to form an ejection port 13. Furthermore, a protection layer (not shown) for protecting the channel forming member 10 was formed by applying liquid resin containing cyclized rubber as main ingredient by spin coating and subsequently baking the liquid resin. Subsequently, a silicon oxide film was formed on the second surface of the silicon substrate 1 and then subjected to a patterning operation by means of buffered hydrofluoric acid, using photoresist as mask, to produce a mask 2 having an opening that defined the area where a hollow was to be formed.

Figure 6C:
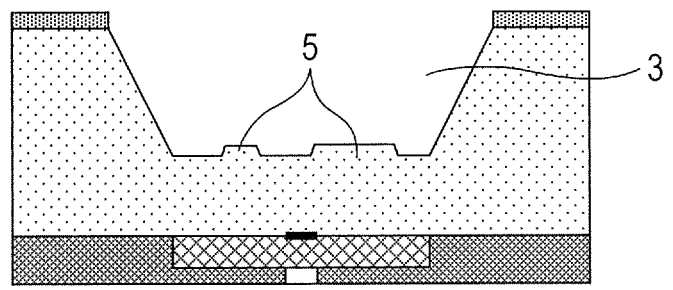

Then, the silicon substrate 1 was immersed in an aqueous solution of tetramethylammonium hydroxide having a concentration of 21 wt % at 83° C. to make the etching operation progress from the opening of the mask 2 on the second surface of the silicon substrate 1 as shown in FIG. 6C. The etching operation was stopped 15 hours after the start of the operation to produce a hollow 3. The thickness of the substrate at the bottom of the hollow 3 was about 200 μm. Differences in level 5 were produced at the bottom of the hollow. Thereafter, the mask 2 of silicon oxide film was removed by means of buffered hydrofluoric acid.

Figure 6D:
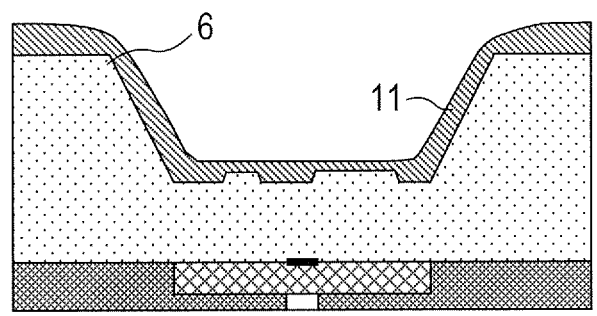

Subsequently, positive resist AZP4620 (trade-name: available from AZ Electronic Materials) was applied by spray coating to the silicon substrate to produce first resist 11 as shown in FIG. 6D. The film thickness of the first resist was about 12 μm at the second surface, about 8 μm at the bottom of the hollow and about 2 μm at the edge portion 6.

Figure 6E:
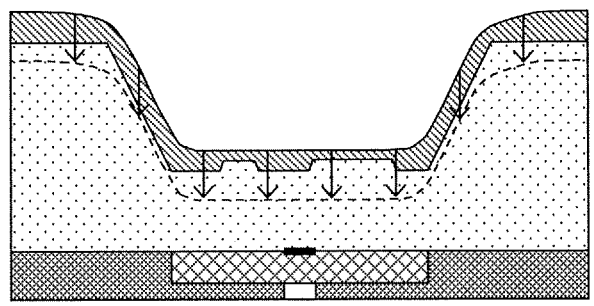
Figure 6F:
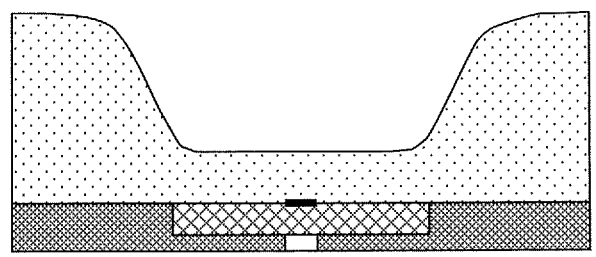

Then, an etching operation was conducted from the side of the second surface of the silicon substrate 1 by reactive ion etching to remove the first resist 11 and part of the silicon substrate 1 as shown in FIGS. 6E and 6F. As a result, the profile of the second surface and that of the hollow of the silicon substrate 1 were made to reflect the surface profile of the first resist 11 before being subjected to etching operation.

A mixture gas of $CF_4$ and $O_2$ was employed with a gas flow rate ratio of $CF_4/O_2$ was made to be equal to 1.5. Other etching conditions included plasma power of 1,000 W, substrate bias of 300 W, etching pressure of 10 Pa and substrate temperature of 20° C. During the etching operation, both the silicon substrate and the positive resist AZP4620 showed a substantially same etching rate.

Figure 6G:
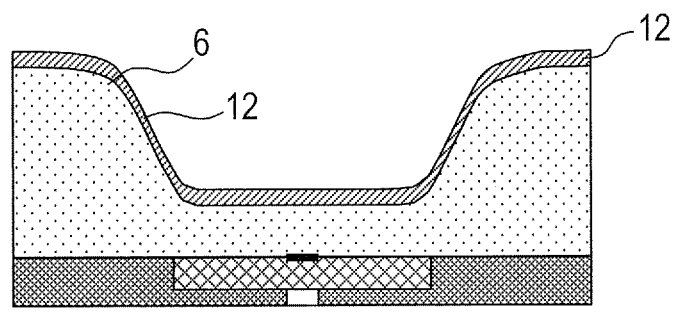

Then, positive resist AZP4620 was applied again by spray coating to form second resist 12 as shown in FIG. 6G. The film thickness of the second resist was about 5 μm at the second surface, about 3 μm at the bottom of the hollow and about 2 μm at the edge portion 6. The coating effect of the second resist 12 at the edge portion 6 was enhanced so that the second resist could be formed as a thin film.

Figure 6H:
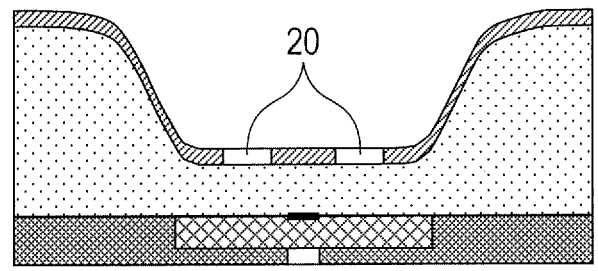

Then, the second resist 12 was subjected to a patterning operation by way of exposure to light/development to form an etching mask having a pattern that defined the slots 4 as shown in FIG. 6H. The bottom of the hollow was flat and the thickness of the second resist 12 at the bottom of the hollow was about 3 μm. Thus, the second resist could be highly accurately patterned.

Figure 6I:
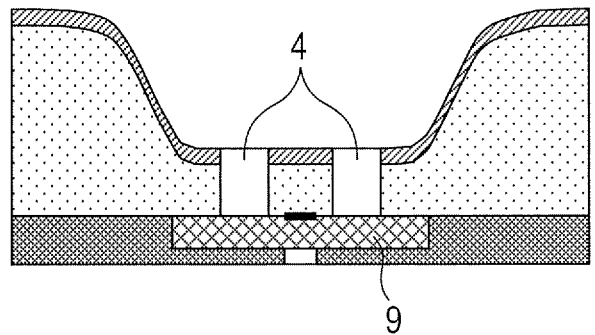

Thereafter, the silicon substrate 1 was etched to the first surface by dry etching, using a Bosch process and an etching mask, to form slots 4 as shown in FIG. 6I. The channel mold material 9 operated as etching stop layer.

Figure 6J:
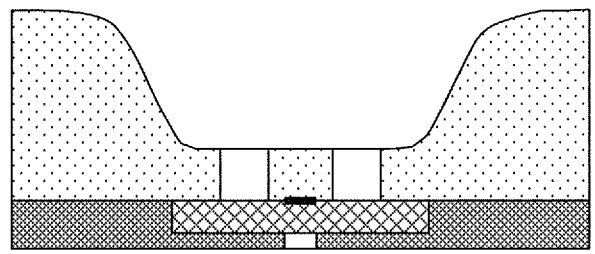

Subsequently, the etching mask was removed by dry etching, using $O_2$ gas as main component, as shown in FIG. 6J.

Figure 6K:
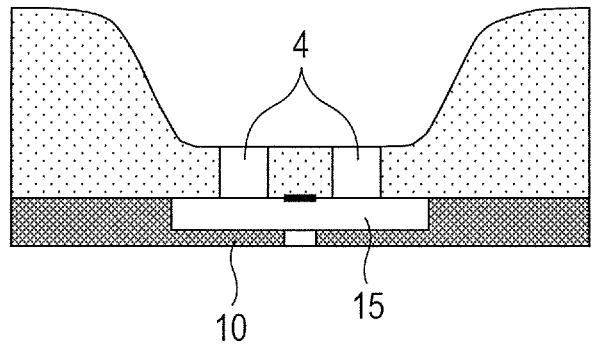

Finally, the channel mold material 9 was dissolved and removed to produce liquid channel 15 as shown in FIG. 6K. More specifically, firstly, the protection layer was dissolved and peeled off by means of xylene. Thereafter, the channel mold material 9 was exposed to UV rays from above the channel forming member 10 for photosensitization and immersed in methyl lactate to elute the channel mold material 9.

The slots 4 of the liquid ejection head prepared in the above-described manner were formed highly accurately at the desired respective positions.

The present invention can be applied to recording heads of inkjet printers.

Thus, the present invention provides a method of manufacturing a liquid ejection head substrate, by means of which slots can be formed highly accurately at the bottom of a hollow of the head substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-166614, filed Jul. 29, 2011, which is hereby incorporated by reference herein in its entirety.

What is claimed is:

1. A method of manufacturing a liquid ejection head substrate including a silicon substrate having a first surface, a second surface disposed opposite to the first surface, and a liquid supply port and slots for supplying liquid to a liquid channel arranged on the first surface, the liquid supply port being formed as hollow at the side of the second surface, the slots being formed as through holes communicating with both the bottom of the hollow and the first surface, the method comprising:
(1) a step of executing a first etching process from the side of the second surface to form the hollow in the silicon substrate;
(2) a step of forming a first resist on the second surface and on the hollow;
(3) a step of executing a second etching process on the first resist to remove at least the first resist on the bottom of the hollow, the second etching process being executed under conditions of securing an equal etching rate to both the silicon substrate and the first resist;
(4) a step of forming a second resist on the hollow;
(5) a step of forming an etching mask by patterning the second resist; and
(6) a step of executing a third etching process, using the etching mask, to form the through holes,
the above steps being conducted in the above listed order.

2. The method according to claim 1, wherein a mixture gas of carbon fluoride and oxygen is employed for the second etching process.

3. The method according to claim 2, wherein the second etching process is executed by means of reactive ion etching.

4. The method according to claim 1, wherein the first resist and the second resist are formed by using a liquid resin.

5. The method according to claim 4, wherein the first resist and the second resist are formed by means of the same technique.

6. The method according to claim 5, wherein the first resist and the second resist are formed by means of spin coating, dipping or spray coating.

7. The method according to claim 6, wherein the first resist and the second resist are formed by means of spray coating.

8. The method according to claim 1, wherein the silicon substrate is a silicon single-crystal substrate and the first etching process employs anisotropic crystal etching.

9. The method according to claim 8, further comprising a step of forming liquid chemical introducing holes at the second surface of the silicon substrate to be executed before step (1).

10. The method according to claim 1, further comprising a step of flattening the surface of at least the part of the first resist formed at the bottom of the hollow to be executed after step (2).

11. The method according to claim 10, wherein the flattening step is a step of fluidizing the first resist.

12. The method according to claim 11, wherein the flattening step is a step of heating the first resist to not lower than the glass transition temperature thereof.

13. The method according to claim 11, wherein the flattening step is a step of blowing a liquid chemical capable of dissolving the first resist against the first resist.

14. The method according to claim 11, wherein the flattening step is a step of fluidizing the part of the first resist formed at the bottom of the hollow.

15. The method according to claim 14, wherein the flattening step includes a process of exposing the region not to be fluidized of the first resist, the first resist being negative resist, to light and hardening the region before fluidizing the first resist.

* * * * *